United States Patent
Kurcik et al.

(10) Patent No.: US 11,444,337 B2
(45) Date of Patent: Sep. 13, 2022

(54) SOLID STATE SWITCH DRIVER CIRCUIT FOR A BATTERY SYSTEM

(71) Applicant: Samsung SDI Co., Ltd., Yongin-si (KR)

(72) Inventors: Peter Kurcik, Sankt Nikolai im Sausal (AT); Maximilian Hofer, Hartberg (AT)

(73) Assignee: SAMSUNG SDI CO., LTD, Yongin-si (KR)

( * ) Notice: Subject to any disclaimer, the term of this patent is extended or adjusted under 35 U.S.C. 154(b) by 290 days.

(21) Appl. No.: 16/815,752

(22) Filed: Mar. 11, 2020

(65) Prior Publication Data
US 2020/0295411 A1  Sep. 17, 2020

(30) Foreign Application Priority Data

Mar. 12, 2019 (EP) .................... 19162233
Feb. 21, 2020 (KR) .................... 10-2020-0021658

(51) Int. Cl.
*H01M 4/02*     (2006.01)
*H01M 10/42*    (2006.01)
*H03K 17/0814*  (2006.01)
*B60L 3/04*     (2006.01)

(52) U.S. Cl.
CPC .......... *H01M 10/4257* (2013.01); *B60L 3/04* (2013.01); *H03K 17/08142* (2013.01); *H01M 2010/4271* (2013.01)

(58) Field of Classification Search
CPC ...................................... H01M 4/02
See application file for complete search history.

(56) References Cited

U.S. PATENT DOCUMENTS

| | | |
|---|---|---|
| 2005/0127879 A1 | 6/2005 | Sato et al. |
| 2006/0181831 A1 | 8/2006 | Kojima |
| 2009/0045851 A1 | 2/2009 | Iwabuchi et al. |
| 2011/0051303 A1 | 3/2011 | Migliavacca |
| 2013/0278300 A1 | 10/2013 | Domingo et al. |

(Continued)

FOREIGN PATENT DOCUMENTS

| | | |
|---|---|---|
| DE | 10 2014 202 643 A1 | 9/2014 |
| EP | 1 531 535 A2 | 5/2005 |

(Continued)

OTHER PUBLICATIONS

Maxim Integrated: "DC-DC Conversion Without Inductors", Maxim Design Support, Technical Documents, Tutorials, Power-Supply Circuits, APP 725, Jul. 22, 2009, pp. 1-8, XP055623085.

(Continued)

*Primary Examiner* — Jacob B Marks
(74) *Attorney, Agent, or Firm* — Lewis Roca Rothgerber Christie LLP

(57) ABSTRACT

In a solid state switch (SSS) driver circuit for controlling a solid state switch operated as high side switch between a battery cell stack and a load, the SSS driver circuit includes: a voltage generation circuit; a switch off circuit; and a switch controller connected to a first output node and to a second output node, wherein the switch controller is configured to: receive a ground voltage via a third ground node, and a fourth control signal; and connect the first output node and a gate node of the solid state switch according to the fourth control signal.

15 Claims, 5 Drawing Sheets

(56) References Cited

U.S. PATENT DOCUMENTS

| | | |
|---|---|---|
| 2014/0293664 A1 | 10/2014 | Dai et al. |
| 2017/0110974 A1 | 4/2017 | Chen |
| 2017/0250609 A1 | 8/2017 | Zhang et al. |
| 2018/0152035 A1 | 5/2018 | Li |
| 2019/0115628 A1* | 4/2019 | Ho ................... H01M 10/46 |

FOREIGN PATENT DOCUMENTS

| | | |
|---|---|---|
| EP | 2 782 233 A1 | 9/2014 |
| EP | 3 352 322 A1 | 7/2018 |
| WO | WO 2012/087320 A1 | 6/2012 |

OTHER PUBLICATIONS

Toshiba: "MOSFET Gate Drive Circuit 1-6 Application Note", Jul. 26, 2018, pp. 1-22, XP055622261, Retrieved from the Internet: URL:https://toshiba.semicon-storage.com [retrieved on Sep. 13, 2019].

Extended European Search Report of corresponding application 19162233.1, dated Sep. 25, 2019, 10 pages.

\* cited by examiner ns,337 B2

SOLID STATE SWITCH DRIVER CIRCUIT FOR A BATTERY SYSTEM

CROSS-REFERENCE TO RELATED APPLICATION

The present application claims priority to and the benefit of European Patent Application No. 19162233.1 filed in the European Patent Office on Mar. 12, 2019, and further claims priority to and the benefit of Korean Patent Application No. 10-2020-0021658, filed on Feb. 21, 2020 in the Korean Intellectual Property Office, the entire content of each of which is incorporated herein by reference.

BACKGROUND

1. Field

Aspects of some example embodiments of the present invention relate to a solid state switch (SSS) driver circuit for a battery system.

2. Background

In the recent years, vehicles for transportation of goods and people have been developed using electric energy as a power source for motion. Such an electric vehicle is an automobile that is propelled by an electric motor, using energy stored in rechargeable batteries. An electric vehicle may be solely powered by batteries or may be a hybrid vehicle powered at least partially, for example, by a gasoline generator. Furthermore, the vehicle may include a combination of an electric motor and a conventional combustion engine. In general, an electric-vehicle battery (EVB) or traction battery is a battery used to power the propulsion of battery electric vehicles (BEVs).

The above information disclosed in this Background section is only for enhancement of understanding of the background and therefore the information discussed in this Background section does not necessarily constitute prior art.

SUMMARY

Aspects of some example embodiments of the present invention relate to a solid state switch (SSS) driver circuit for a battery system, for example, to a SSS driver circuit with an improved availability of switch driving capability as well as an improved reliability of shutting of the SSS in state of an emergency. According to some example embodiments, the SSS driver circuit meets ASIL B requirements with respect to availability and ASIL C requirements with respect to shut off functionality. Aspects of some example embodiments of the present invention further relates to a battery system with the SSS driver circuit.

Aspects of some example embodiments include a solid state switch driver circuit for a battery system and a battery system according to the appended claims.

Aspects of some example embodiments of the present disclosure include a solid state switch (SSS), and a driver circuit for controlling a solid state switch operated as a high side switch between a battery cell stack and a load. The SSS driver circuit may be configured as a hardware based circuit, and may not include any programmed elements itself. By omitting programmed elements, the computation time of the SSS driver circuit may be increased. The SSS driver circuit may be connected to the solid state switch of the battery system. Further, according to some example embodiments, the SSS driver circuit may receive and transmit signals to and from a microcontroller (e.g., a BMS).

According to some example embodiments, the SSS driver circuit includes a voltage generation circuit, VGC, which is configured for receiving a supply voltage, $V_{SUP}$, via a first input node, i.e., comprises a first input node that receives $V_{SUP}$ during the operation of the SSS driver circuit. The VGC may further be configured for receiving an output voltage of the battery cell stack, $GND_{DRIVER}$, via a second input node and, for example, includes a second node that receives $GND_{DRIVER}$ during the operation of the SSS driver circuit. The VCG is further configured to receive a ground voltage, GND, via a first ground node (e.g., comprises a first ground node that receives GND during the operation of the SSS driver circuit). The VGC may further be configured to receive a first control signal, PWM, via a first control node (e.g., comprises a first control note that selectively receives the first control signal during the operation of the SSS driver circuit). The VGC may further be configured to generate a drive voltage, $VCC_{DRIVER}$, higher than $V_{SUP}$ and $GND_{DRIVER}$ and for outputting $VCC_{DRIVER}$ to a first output node according to the first control signal.

According to some example embodiments, the VGC of the invention may thus be configured to generate a voltage that is sufficient for setting the high side solid state switch of a battery system conductive. Such a voltage has to be higher than the voltage provided to the solid state switch from the battery cell stack. The VGC according to some example embodiments may derive such voltage from $GND_{DRIVER}$ and $V_{SUP}$, wherein the latter may be smaller than $GND_{DRIVER}$. According to some example embodiments, $VDD_{DRIVER}$ may also be self-supplied by a battery system in which the SSS driver circuit is utilized. According to some example embodiments, $GND_{DRIVER}$ may be provided to the SSS driver circuit by a system basis chip of the battery system, which is power supplied by the battery system. According to some example embodiments, $GND_{DRIVER}$ may be between 10 V and 30 V, between 15 V and 25 V, or may be 20 V. According to some example embodiments, $VCC_{DRIVER}$ equals (or roughly equals) the sum of $V_{SUP}$ and $GND_{DRIVER}$, e.g., $VCC_{DRIVER}$~68V with $V_{SUP}$~20V and $GND_{DRIVER}$~48V.

According to some example embodiments, an SSS, to which the driver circuit is connected, comprises at least one power MOSFET that is realized as a high side switch in the battery system, for example, a 48 V battery system. For steering the gate voltage of the MOSFET, a non-grounded voltage domain may be utilized. This steering voltage may be provided by the VGC as $VCC_{DRIVER}$ in a cost-effective manner (e.g., without the need for a transformer). The first control signal may be a PWM signal (e.g., a square wave signal alternately taking the value of "0" and "1" or the like). Based on this signal, $VCC_{DRIVER}$ is generated by the VGC acting as a DCDC converter. In other words, the amplitude of $VCC_{DRIVER}$ may be set via the duty cycle of the PWM signal. Further, according to some example embodiments, $VCC_{DRIVER}$ may be output by the VGC continuously as long as the first control signal is applied to the VGC and may not be output if no first control signal is applied to the VGC.

According to some example embodiments, the SSS driver circuit of the invention further comprises a switch off circuit (SOC), that is configured for receiving the output voltage $GND_{DRIVER}$ via a third input node (e.g., comprises a third input node that receives $GND_{DRIVER}$ during the operation of the SSS driver circuit). The SOC may further be configured for receiving a ground voltage (GND), via a second ground node (i.e., comprises a second ground note that receives GND during the operation of the SSS driver circuit). The SOC may further be configured to receive a second control signal, OFF1, via a second control node (i.e., comprises a second control node that selectively receives OFF1 during the operation of the SSS driver circuit). The SOC may further be configured to receive a third control signal, OFF2, via a third control node (i.e., comprises a third control node that selectively receives OFF2 during the operation of the SSS driver circuit).

According to some example embodiments, the SOC may further be configured for outputting $GND_{DRIVER}$ to a second output node according to the second and third control signals. As shown in more detail below, the SOC may be configured to provide a signal (e.g., $GND_{DRIVER}$) which is suitable for setting the SSS, to which the driver circuit is connected, nonconductive. Hence, by outputting $GND_{DRIVER}$ based on the second and third control signals, OFF1 and OFF2, redundancy in providing the shut off signal $GND_{DRIVER}$ may be realized. According to some example embodiments, the $GND_{DRIVER}$ may be output to the second output node if one of the second and third control signals, OFF1 and OFF2, takes a specific value. In other words, $GND_{DRIVER}$ may not be output continuously from SOC. The SOC of the SSS driver circuit of the invention may thus be configured to reliably and quickly output $GND_{DRIVER}$ when any one of the second and third control signals OFF1 or OFF2 takes a predetermined value.

According to some example embodiments, the SSS driver circuit of the invention may further include a switch controller (e.g., a switch controller circuit), which is connected to the first output node of the VGC and to the second output node of the SOC. The switch controller may further be configured for receiving a ground voltage, GND, via a third ground node, i.e., comprises a third ground node that receives GND during the operation of the SSS driver circuit. The switch controller may further be configured to receive a fourth control signal, ON1, via a fourth control node, i.e., comprises a fourth control node that selectively receives ON1 during the operation of the SSS driver circuit. The switch controller may be configured for forwarding, i.e., outputting, one of the voltages, $VCC_{DRIVER}$, and $GND_{DRIVER}$, to a gate node of the solid state switch according to the fourth control signal.

According to some example embodiments, the switch controller of the SSS driver circuit may be configured to receive the $VCC_{DRIVER}$ as a high side switching signal suitable for setting the SSS, to which the SSS driver circuit is connected to, conductive. The switch controller of the SSS driver circuit may further configured to receive $GND_{DRIVER}$ as switching signal suitable for setting the SSS, to which the SSS driver circuit is connected to, nonconductive. Further, according to some example embodiments, depending on a value of the fourth control signal, the switch controller either connects or disconnects the first output node and a gate node of the solid state switch (e.g., to the gates of MOSFETS thereof). Further, according to some example embodiments, depending on the value of the fourth control signal, the switch controller forwards the voltage present at the second output node (e.g., $GND_{DRIVER}$), to a gate node of the solid state switch (e.g., to the gates of MOSFETS thereof). According to some example embodiments, the switch controller outputs one of $VCC_{DRIVER}$ or $GND_{DRIVER}$ to an output node thereof, depending on the value of the fourth control signal. According to some example embodiments, the switch controller actively switches solely $VCC_{DRIVER}$ to the gate node according to ON1, wherein the voltage at the second output node (e.g. $GND_{DRIVER}$), which may always be lower than $VCC_{DRIVER}$, is otherwise connected to the gate node in a passive manner. Therein, whether or not $GND_{DRIVER}$ is applied to the second output node depends on the second and third control signals OFF1 and OFF2 as described above.

According to some example embodiments of the invention, in the solid state switch (SSS) driver circuit, the voltage generation circuit may include a first capacitor with a first capacitor node connected to the first input node via a first diode and with a second capacitor node connected to either the first ground node or to the second input node according to the first control signal. According to some example embodiments, the first capacitor node may be connected to the cathode of the first diode and the anode of the first diode may be connected to the first input node. According to some example embodiments, switches may be interconnected between the second capacitor node and the first ground node and the second input node, respectively. Thus, the potential of one of these nodes may be selectively applied to the second capacitor node based on the states of these switches.

According to some example embodiments, during operation of the SSS driver circuit, the second capacitor node is first connected to the first ground node and the first capacitor is thus charged with $V_{SUP}$ applied to the first supply node via the first diode. Subsequently, the second capacitor node is connected to the second input node and hence put on $GND_{DRIVER}$ potential. As the voltage drop over the first capacitor has to be maintained, the first capacitor node may thus be shifted up by the difference of ($GND_{DRIVER}$-GND), i.e., usually by $GND_{DRIVER}$. In other words, in the SSS driver circuit of the invention, a flying cap may be used for shifting the voltage level for switch control. The first capacitor may therefore be operated as a flying capacitor with suitable capacity.

According to some example embodiments, the voltage generation circuit comprises a first switch that is configured to connect the second capacitor node to the first ground node in response to the first control signal having a first value and a second switch that is configured to connected the second capacitor node to the second input node in response to the first control signal having a second value. According to some example embodiments, the first value may be a high value, e.g., "1", of the square wave PWM first control signal and the second value may be a low value, e.g., "0", of the square wave PWM first control signal. According to some example embodiments, the first switch might be configured as a first MOSFET, $T_1$, particularly as an n-channel MOSFET having a gate node directly connected to the first control node. Further, the second switch might be configured as a second MOSFET, $T_2$, particularly a p-channel MOSFET having a gate node connected to the first control node via an inverter. According to some example embodiments, the first switch might be a p-channel MOSFET and the second switch may be an n-channel MOSFET and/or the first control signal might be used with reversed polarity. Also, other circuit configurations using more than one transistor for the first switch and/or the second switch may be utilized. According to some example embodiments, the second switch may be conductive when first switch is non-conductive and vice versa.

According to some example embodiments, in the solid state switch (SSS) driver circuit, the voltage generation circuit comprises a Zener diode that is interconnected between the first output node and the second input node. According to some example embodiments, a cathode of the Zener diode is connected to the first capacitor node of the first capacitor via a second diode. Therein, the cathode of the second diode may be connected to the cathode of the Zener diode and the anode of the second diode is connected to the first capacitor node. According to some example embodiments, an anode of the Zener diode is connected to the second input node and the second capacitor node of the first capacitor via the second switch. According to some example embodiments, the second switch as described above is interconnected between the anode of the Zener diode and the second capacitor node of the first capacitor. According to some example embodiments, the Zener diode may be configured as a protection diode that is configured for ensuring that the $VCC_{DRIVER}$ is limited to a certain voltage. According to some example embodiments, the Zener diode may be configured for limiting $VCC_{DRIVER}$ to a voltage of about 20 V.

According to some example embodiments, the voltage generation circuit comprises a second capacitor that is interconnected in parallel to the first capacitor in between first output node and second input node. The second capacitor may also be connected in parallel to the Zener diode. According to some example embodiments, the second capacitor comprises a first capacitor node that is connected to the first output node and may be interconnected between the first output node and the cathode of the Zener diode. According to some example embodiments, the second capacitor comprises a second capacitor node that is connected to the second input node, and may be interconnected between the second input node and the anode of the Zener diode. According to some example embodiments, when the second switch is set to be conductive and the first switch is set to be non-conductive (e.g., when the first capacitor node of the first capacitor is shifted to $VCC_{DRIVER}$), the second capacitor may be charged with the voltage at the first capacitor node via the second diode.

Hence, the second capacitor may be charged with $VCC_{DRIVER}$ and thus may store the energy to set the SSS conductive. Hence, even if the voltage generation by the VGC of the SSS driver circuit is impaired, there may be sufficient energy stored in the second capacitor. The second capacitor may be configured to keep the SSS to stay conductive for a given time (e.g., depending on the capacity of the second capacitor) to provide a "limp home" functionality to an electric vehicle provided with a battery system having the SSS driver circuit of the invention. In order to meet an ASIL B standard for such an electric vehicle, the second capacitor may have a capacity that is chosen such that the SSS can be maintained conductive for a minimal duration in between 35 seconds and 1 minute.

According to some example embodiments, in the SSS driver circuit, the switch controller as described above further comprises a third switch that is configured to connect the first output node to the gate node (e.g., a corresponding output node of the switch driver) in response to the fourth control signal having a first value and to disconnect the first output node from the gate node in response to the fourth control signal having a second value. In other words, the third switch forwards $VCC_{DRIVER}$ to the gate node in response to the fourth control signal having a first value. According to some example embodiments, the gate node may be connected directly to the second output node. Hence, if $VCC_{DRIVER}$ is not forwarded to the gate node, the potential that applies to the second output node may also be applied to the gate node. The potential at the second output node may be either floating or $GND_{DRIVER}$ as set forth in more detail below.

According to some example embodiments, the third switch is a third MOSFET, $T_3$, for example, a p-channel MOSFET with a source node connected to the first output node and a drain node connected to the second output node. According to some example embodiments, the switch controller further comprises a fourth switch that is configured to connect a gate node of the third MOSFET to the third ground node, i.e., GND, in response to the fourth control signal having a first value and to disconnect the gate node of the third MOSFET from the third ground node in response to the fourth control signal having a second value. According to some example embodiments, the fourth switch is a fourth MOSFET, $T_4$, for example, an n-channel MOSFET with a source node connected to the third ground node, i.e., GND, the drain node connected to the gate node of the third MOSFET. Then the fourth control signal may be applied to the gate node of the fourth MOSFET and the first value is a high value, e.g., "1" or VDD, and the second value may be a low value, e.g., "0" or GND.

According to some example embodiments, in the solid state switch (SSS) driver circuit, the switch off circuit comprises a fifth switch that is configured to connect the third input node to the second output node in response to the second control signal having a first value and to disconnect the third input node from the second output node in response to the second control signal having a second value. According to some example embodiments, the switch off circuit may include a seventh switch that is configured to connect the third input node to the second output node in response to the third control signal having a first value and to disconnect the third input node from the second output node in response to the third control signal having a second value. Hence, redundancy in selectively connecting the third input node, i.e., $GND_{DRIVER}$, to the second output node is provided by the fifth and seventh switches.

According to some example embodiments, the fifth switch is a fifth MOSFET, $T_5$, for example, a p-channel MOSFET with a source node connected to the second output node and a drain node connected to the third input node. According to some example embodiments, the switch off circuit further comprises a sixth switch that is configured to connect a gate node of the fifth MOSFET to the second ground node in response to the second control signal having a first value and to disconnect the gate node of the fifth MOSFET from the second ground node in response to the second control signal having a second value. According to some example embodiments, the sixth switch is a sixth MOSFET, $T_6$, for example, an n-channel MOSFET with a source node connected to the second ground node, i.e., GND, and a drain node connected to the gate node of the fifth MOSFET. Then the second control signal is provided to the gate node of the fifth MOSFET and the first value is a high signal, e.g., "1" or VDD, and the second value is a low value, e.g., "0" or GND, VSS.

According to some example embodiments, the seventh switch is a seventh MOSFET, $T_7$, for example, a p-channel MOSFET with a source node connected to the second output node and a drain node connected to the third input node. According to some example embodiments, the switch off circuit further comprises an eighth switch that is configured to connect a gate node of the seventh MOSFET to the second ground node in response to the third control signal having a first value and to disconnect the gate node of the seventh MOSFET from the second ground node in response to the third control signal having a second value. According to some example embodiments, the eighth switch is an eighth MOSFET, $T_9$, for example, an n-channel MOSFET with a source node connected to the second ground node and a drain node connected to the gate node of the seventh MOSFET. Then the second control signal may be provided to the gate node of the eighth MOSFET and the first value is a high signal, e.g., "1" or VDD, and the second value is a low value, e.g., "0" or GND, VSS.

According to some example embodiments, the solid state switch (SSS) driver circuit further comprises a first diagnostic circuit that configured to output a first diagnostic signal, $DIAG_1$, indicating a potential at the second input node and to output a second diagnostic signal, DIAG2, indicating a potential at the first output node. According to some example embodiments, the first diagnostic circuit comprises a first voltage divider with a first divider node connected to the second input node and a second divider node connected to the first ground node (GND). An output node of the first voltage divider may then provide the first diagnostic signal. According to some example embodiments, the first diagnostic circuit comprises a second voltage divider with a first divider node connected to the first output node and a second divider node also connected to GND. An output node of the second voltage divider may then provide the second diagnostic signal. The first diagnostic circuit may thus provide first and second diagnostic signals that are indicative of the voltage drop over the second capacitor as described above. Hence, the first diagnostic circuit may allow detecting malfunctions in the battery system, as the first diagnostic circuit receives the same voltage, $GND_{DRIVER}$, as applied to the input of the SSS. The first diagnostic circuit may further allow testing of the fifth switch and the seventh switch.

According to some example embodiments, the SSS driver circuit of the invention may include a second diagnostic circuit that is configured to output a third diagnostic signal, $DIAG_3$, indicating a potential at the second output node. According to some example embodiments, the second diagnostic circuit may be configured to output a third diagnostic signal, $DIAG_3$, indicating a potential at the drain node of the third switch MOSFET T3. According to some example embodiments, the second diagnostic circuit includes a third voltage divider with a first divider node connected in between the second output node and the drain node of the third switch MOSFET T3 and a second divider node connected to ground, GND. The second diagnostic circuit may allow for testing the functionality of the third switch described above, for example, while operating the voltage generation circuit with a PWM signal configured for outputting a voltage via the first output node that is lower than $VCC_{DRIVER}$.

Aspects of some example embodiments of the invention relate to a battery system, for example, a battery system for an electric vehicle such as, for example, a high voltage battery system for enabling electric driving of an electric vehicle. The battery system may include a battery cell stack comprising a plurality of battery cells and being configured for supplying an output voltage, $GND_{DRIVER}$, to a stack node. According to some example embodiments, the battery cell stack comprises a plurality of battery cells interconnected in parallel and/or in series between a ground node and the stack node. According to some example embodiments, the battery cell stack may be configured for providing a voltage of 48 V. The battery system of the invention further comprises a solid state switch (SSS) that is interconnected between the stack node and a supply node. The SSS may be a solid state power switch such as, for example, a MOSFET power switch. The solid state switch may include at least one set of anti-serially interconnected FETs, each set comprising at least one first FET, $T_A$, and at least one second FET, $T_B$. Therein, the gate contacts of the FETs may be electrically interconnected and the source contacts of the FETs are electrically interconnected. Further, at least one first drain contact of the at least one first FET may be electrically connected to the stack node and at least one second drain contact of the at least one second FET may be electrically connected to the supply node. The battery system of the invention may further include the solid state switch driver circuit according to the invention as described above, wherein the interconnected gate contacts of the FETs are connected to the gate node. In other words, the output node of the switch driver of the SSS driver circuit as described above may be connected to the gate node, for example, the interconnected gates of the SSS. Hence, the output signal of the SSS driver circuit may selectively set the MOSFETS of the SSS either conductive or nonconductive based on the control signals, ON1, OFF1, OFF2.

According to some example embodiments of the invention, the supply voltage, $V_{SUP}$, which applies to the first input node of the SSS driver circuit of the invention, is supplied by the battery cell stack of the battery system. In other words, the SSS driver circuit may be self-supplied by the battery system, the power output of which it controls via the SSS. According to some example embodiments, the SSS driver circuit may be supplied by a system basis chip of the battery system, wherein the system basis chip receives its supply voltage from the battery cell stack of the battery system. The system basis chip may include one or more further functions with respect to the battery system such as, for example, voltage control, reset function, watchdog function, wake up function, etc.

According to some example embodiments, the battery system of the invention further comprises a microcontroller that is configured to operate the SSS driver circuit of the invention. According to some example embodiments, the microcontroller is configured to receive at least one signal indicative of an operation state of the battery system. The at least one signal indicative of an operation state of the battery system may include a voltage signal, a current signal, a temperature signal, a crash indication signal, or the like. The current signal may be obtained by a shunt resistor that is connected downstream of the stack node of the battery cell stack. The microcontroller may further be configured to determine, based on the at least one signal indicative of an operation state of the battery system, the presence of an abnormal operation state of the battery system such as, for example, an overcurrent, a thermal runaway, a crash of the vehicle, etc. The microcontroller may further be configured to generate and output each of the first control signal, the second control signal and the third control signal as described above according to the determined operation state of the battery system. According to some example embodiments, the microcontroller may be configured to control, via the second and third control signal, the conductivity state of SSS set by the SSS driver circuit. According to some example embodiments, the microcontroller may be configured to control, via the second control signal, the amplitude of the $VCC_{DRIVER}$ voltage generated by the voltage generation circuit. Additionally, the microcontroller may be configured to perform at least one other control function with respect to the battery system. According to some example embodiments, the microcontroller is at the same time configured as BMS/BSM and is configured to perform cell balancing, voltage and/or current measurements or the like.

According to some example embodiments of the battery system, the microcontroller is further configured to receive at least one of the first diagnostic signal, the second diagnostic signal, or the third diagnostic signal. According to some example embodiments, the microcontroller is further configured to determine, based on this at least one diagnostic signal, the operability of the SSS driver circuit and or the operation state of the battery system. For example, the microcontroller may be configured to determine whether or not a failure is present in the battery system based on the first and second diagnostic signals that indicate the voltage gap over the second capacitor. According to some example embodiments, the microcontroller is configured to determine the operability of the third switch, the fifth switch and/or the seventh switch based on the third diagnostic signal and the specific test procedure performed using the second diagnostic circuit.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. The electrical connections or interconnections described herein may be realized by wires or conducting elements, e.g. on a PCB or another kind of circuit carrier. The conducting elements may comprise metallization, e.g. surface metallizations and/or pins, and/or may comprise conductive polymers or ceramics. Further electrical energy might be transmitted via wireless connections, e.g. using electromagnetic radiation and/or light.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media, e.g. a CD, flash drive, or the like.

Also, a person of skill in the art should recognize that the functionality of various computing devices may be combined or integrated into a single computing device, or the functionality of a particular computing device may be distributed across one or more other computing devices without departing from the scope of the embodiments of the present invention.

Further aspects of some example embodiments of the present invention are disclosed in the dependent claims or the following description of the drawings.

BRIEF DESCRIPTION OF THE DRAWINGS

Further characteristics and features of some example embodiments will become more apparent to those of ordinary skill in the art by describing in more detail aspects of some example embodiments with reference to the attached drawings in which.

DETAILED DESCRIPTION

Figure 1:
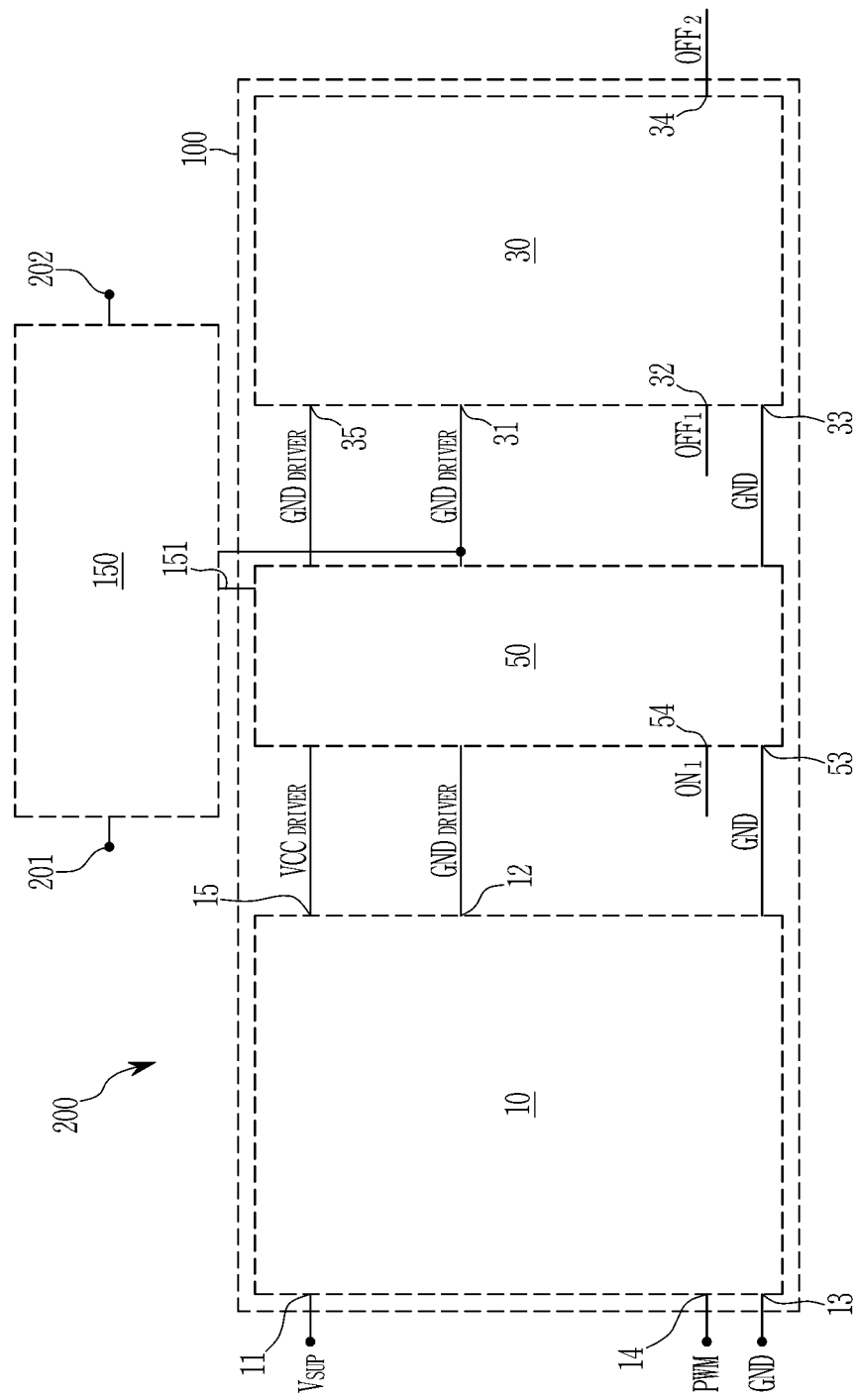
FIG. 1 schematically illustrates a solid state switch driver circuit according to some example embodiments.

Reference will now be made in more detail to embodiments, examples of which are illustrated in the accompanying drawings. Effects and features of the example embodiments, and implementation methods thereof will be described with reference to the accompanying drawings. In the drawings, like reference numerals denote like elements, and redundant descriptions may be omitted. Embodiments according to the present invention, however, may be embodied in various different forms, and should not be construed as being limited to only the illustrated example embodiments herein. Rather, these embodiments are provided as examples so that this disclosure will be more thorough and more complete, and will more fully convey the aspects and features of the example embodiments of the present invention to those skilled in the art.

Accordingly, processes, elements, and techniques that are not considered necessary to those having ordinary skill in the art for a complete understanding of the aspects and features of the present invention may not be described. In the drawings, the relative sizes of elements, layers, and regions may be exaggerated for clarity.

As used herein, the term "and/or" includes any and all combinations of one or more of the associated listed items. Further, the use of "may" when describing embodiments of the present invention refers to "one or more embodiments of the present invention." In the following description of example embodiments of the present invention, the terms of a singular form may include plural forms unless the context clearly indicates otherwise.

It will be understood that although the terms "first" and "second" are used to describe various elements, these elements should not be limited by these terms. These terms are only used to distinguish one element from another element. For example, a first element may be named a second element and, similarly, a second element may be named a first element, without departing from the scope of the present invention. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, if the term "substantially" is used in combination with a feature that could be expressed using a numeric value, the term "substantially" denotes a range of +/−5% of the value centered on the value.

Electric-vehicle batteries, which are used as a power source for an electric motor, differ from starting, lighting, and ignition batteries utilized as part of combustion engine systems because they are designed to give power over sustained periods of time. A rechargeable or secondary battery differs from a primary battery in that a rechargeable battery can be repeatedly charged and discharged, while a secondary battery provides only an irreversible conversion of chemical to electrical energy (i.e., cannot generally be repeatedly charged and discharged). Low-capacity rechargeable batteries may be used as a power supply for small electronic devices, such as cellular phones, notebook computers and camcorders, while high-capacity rechargeable batteries may be used as the power supply for hybrid vehicles and the like.

In general, rechargeable batteries may include an electrode assembly including a positive electrode, a negative electrode, and a separator interposed between the positive and negative electrodes, a case receiving or enclosing the electrode assembly, and an electrode terminal electrically connected to the electrode assembly. An electrolyte solution may be injected into the case in order to enable charging and discharging of the battery via an electrochemical reaction of the positive electrode, the negative electrode, and the electrolyte solution. The shape of the case (e.g., cylindrical or rectangular), depends on the design of the battery and the corresponding use of the battery. Lithium-ion (and similar lithium polymer) batteries, which may be used, for example, in laptops and other consumer electronics, may also be utilized in electric.

Rechargeable batteries may be used as a battery module formed of a plurality of unit battery cells coupled in series and/or in parallel so as to provide relatively high energy density, for example, for motor driving of a hybrid vehicle. That is, the battery module may be formed by interconnecting the electrode terminals of the plurality of unit battery cells depending on a required amount of power and in order to realize a relatively high-power rechargeable battery.

A battery pack is a set of any number of (e.g., identical) battery modules. They may be configured in a series, parallel or a mixture of both to deliver the desired voltage, capacity, or power density. Components of battery packs include the individual battery modules, and the interconnects, which provide electrical conductivity between them.

For meeting the dynamic power demands of various electrical consumers connected to the battery system a static control of battery power output and charging may not be sufficient. Thus, there may be a steady or intermittent exchange of information between the battery system and the controllers of the electricity-consuming components. This information includes the battery system's actual state of charge (SoC), potential electrical performance, charging ability and internal resistance as well as actual or predicted power demands or surpluses of the consumers.

For monitoring, controlling and/or setting of the aforementioned parameters a battery system may include a battery management unit (BMU), a battery management system (BMS), and/or a battery system manager (BSM). Each of these control units may be realized as an integrated circuit (IC), a microcontroller (μC), an application specific integrated circuit (ASIC), or the like. Control units may be an integral part of the battery system and may be located within a common housing or may be part of a remote control module communicating with the battery system via a suitable communication bus. In both cases, the control unit may communicate with the electrical consumers via a suitable communication bus (e.g., a CAN or SPI interface).

Further, a battery system may include a battery disconnect unit (BDU), configured for disconnecting the battery stack from a downstream load in an abnormal operation condition such as, for example, over temperature, over current, over voltage, crash of an electric vehicle, or the like. The BDU may include at least one relay between a node of the battery stack, for example, the high voltage node thereof, and a downstream load. However, due to construction space requirements, increased demands with respect to switching speed and energy conversation, semiconductor-based solutions for BDUs may be utilized. However, such semiconductor-based switches, for example, MOSFET switches, may utilize specific driver circuits.

The driver circuit for such a MOSFET switch may be located on a separate circuit carrier or may share a circuit carrier with another control unit of the battery system, for example, the BMS. In order to be integrable in an electric vehicle, the driver switch may fulfill the safety standards that apply to electric vehicles such as, for example, ASIL A, ASIL, B, ASIL, C, etc. However, driver stages for solid state power switches may not fulfill these safety standards and/or the realization of the known driver stages for solid state power switches may be cost intensive.

Thus, some example embodiments of the present invention may provide a solid state switch (SSS), and a driver circuit for a battery system that can fulfill the safety standards that apply to electric vehicles and that can be realized in a cost-effective manner.

FIG. 1 schematically illustrates a solid state switch (SSS) driver circuit 100 according to some example embodiments of the present invention. The SSS driver circuit 100 is configured for controlling a solid state switch (SSS) 150, interconnected between a stack node 201 and a supply node 202. Therein, the stack node 201 is connected to a battery cell stack that provides an output voltage of the battery cell stack, for example, 48 V, to the stack node 201. The supply node 202 is configured to be connected to one or more loads or a load circuit for supplying power to the one or more loads. The SSS 150 is configured to selectively connect or disconnect the stack node 201 and the supply node 202. For example, the SSS 150 shall enable disconnecting the battery cell stack from any load in an abnormal operation condition. The SSS 150 is operated as a high side switch between the stack and the supply node 202.

The SSS driver circuit 100 as illustrated in FIG. 1 is configured to output a control signal to the SSS 150, for example, to a gate node 151 of the SSS 150. The control signal is output to the gate node via an output node of the SSS driver circuit 100 that corresponds to the gate node 151. However, in the following it is solely referred to the gate node 151. The control signal output by the SSS driver circuit 100 to the SSS 150 is for selectively setting the SSS 150 conductive or non-conductive and is generated as explained in more detail below.

The SSS driver circuit 100 as shown in FIG. 1 comprises a voltage generation circuit 10, a shut off circuit 30 and a switch controller 50. These sub-circuits of the SSS driver circuit 100 realize different functionalities in the SSS driver circuit and are characterized by their respective inputs and outputs as follows. The voltage generation circuit (VGC) 10 comprises a first input node that receives a supply voltage, $V_{SUP}$, which is supplied indirectly by the battery cell stack, for example, by a system basis chip of a battery system comprising the battery cells. The VGC 10 further comprises a second input node 12 that receives an output voltage of the battery cell stack, in the following referred to as $GND_{DRIVER}$. The VGC 10 further comprises a first ground node 13 for receiving a ground voltage, GND. The ground voltage GND may be a common ground of the SSS driver circuit 100, the stack and the battery system.

The VGC 10 is level shift circuit for outputting a voltage shifted up from an input voltage through a charge pump circuit. The VGC 10 may include a first input node 11 that receives the supply voltage $V_{SUP}$, which is an input voltage, and the $V_{SUP}$ may be a voltage supplied by the battery system 200 itself. For example, the $V_{SUP}$ is supplied from a battery cell stack (not shown) of the battery system, or indirectly supplied by a system basis chip (not shown) of the battery system. The VGC 10 is configured for generating a drive voltage $VCC_{DRIVER}$ using the supply voltage $V_{SUP}$ and the output voltage $GND_{DRIVER}$. Therein the drive voltage is higher than $V_{SUP}$ as well as higher than $GND_{DRIVER}$. Further, $GND_{DRIVER}$ is higher than $V_{SUP}$, for example, $V_{SUP}$ may be about 20 V and $GND_{DRIVER}$ may be about 48 V. The drive voltage $VCC_{DRIVER}$ is suitable for setting the SSS 150 conductive when it is applied to the gate node 151 of the SSS 150. In the VGC 10, the drive voltage $VCC_{DRIVER}$ is generated according to a first control signal. The first control signal is applied to the VGC 10 via a first control node 14 and may be a pulse-width-modulating (PWM) signal. The duty cycle of the PWM signal received via the first control node 14 may control the amplitude of the drive voltage $VCC_{DRIVER}$. In other words, the VGC 10 operates as a DCDC converter the conversion ratio of which is controlled via the first control signal. The drive voltage $VCC_{DRIVER}$ is output to a first output node 15 of the VGC 10. According to some example embodiments, the drive voltage $VCC_{DRIVER}$ is output continuously to the first output node 15. Thus, according to some example embodiments, the VGC 10 may generate a voltage that is high enough to set to be conductive at a high side SSS 150 interconnected between a battery stack and a load from a voltage provided by that battery stack. That is, the VGC 10 may performs a voltage up-conversion operation.

The SSS driver circuit 100 of the invention further comprises a switch off circuit (SOC) 30 that comprises a third input node that also receives the output voltage $GND_{DRIVER}$. The SOC 30 further comprises a second ground node that also receives the ground voltage (GND). Further, the SOC 30 comprises a second control node 32 that receives a second control signal OFF1 and further comprises a third control node 34 that receives a third control signal, OFF2. Therein, the second control signal and the third control signal may be binary signals. That is, the second control signal and the third control signal may take one of two values, for example, of a high value "1" and a low value "0". Therein, these values can be represented by specific voltages or specific currents. The SOC 30 is configured for outputting the output voltage $GND_{DRIVER}$ to a second output node 35 according to (or based on) the second and third control signals. In other words, the SOC 30 is configured to output a voltage for setting the high side SSS 150 to be non-conductive according to two signals, i.e., OFF1 and OFF2. For example, the SOC 30 may be configured to output the $GND_{DRIVER}$ if at least one of the two control signals OFF1 or OFF2 takes a specific value, e.g., a high value "1". Otherwise, the SOC 30 does not output the $GND_{DRIVER}$ to the second output node 35 and hence the second output node 35 is floating. Therein, the output's dependency of the second control signal OFF1 and the third control signal OFF2 provides redundancy in setting the SSS 150 to be non-conductive and thus increases the operational safety of the SSS 150.

The SSS driver circuit 100 further comprises a switch controller 50, which is another sub-circuit of the SSS driver circuit 100. The switch controller 50 is connected to the first output node 15 of the VGC 10 from which it receives the drive voltage $VCC_{DRIVER}$ generated according to the first control signal. The switch controller 50 is further connected to the second output node 35 of the shut off circuit 30 from which it receives the output voltage $GND_{DRIVER}$ according to the second and third control signal. The switch controller 50 further comprises a third ground node 53 that also receives the ground voltage GND. The switch controller 50 further comprises a fourth control node 54 that receives a fourth control signal ON1. According to some example embodiments, the fourth control signal is a binary signal, i.e., takes one of two values, e.g., either a high value "1" or a low value "0". Therein, these values can be represented by specific voltages or specific currents. The switch controller 50 is configured to forward one of the received voltages, $VCC_{DRIVER}$, and $GND_{DRIVER}$, to a gate node 151 of the solid state switch 150 via an output node of the switch controller 50 and in according to the fourth control signal, ON1. In other words, if the fourth control signal takes a first value the switch controller 50 outputs $VCC_{DRIVER}$ and when the fourth control signal takes a second value the switch controller 50 outputs $GND_{DRIVER}$ or a floating voltage to the gate node 151.

The SSS driver circuit 100 of the invention allows the operation of an SSS 150 using solely voltages supplied within the battery system as well as a minimal set of control signals, while maintaining high functional safety during operation. For example, only if ON1 is applied with a first value to switch controller 50, the $VCC_{DRIVER}$ voltage is output to the gate node 151 and the SSS 150 is set to be conductive. Otherwise, the voltage present at the second output node 35 is directly forwarded to the gate node 151. Further, if at least one of OFF1 or OFF2 is applied with a certain value to SOC 30, the $GND_{DRIVER}$ voltage is applied to the second output node 35 and, if ON1 takes a second value, to the gate node 151 and SSS 150 is set to be non-conductive. Hence, the SSS driver circuit 100 provides a cost-effective solution for controlling the SSS 150 without the need for, for example, a transformer for generating $VCC_{DRIVER}$, and with improved redundancy in setting the SSS 150 to be non-conductive based on the two signals OFF1, OFF2.

Figure 2:
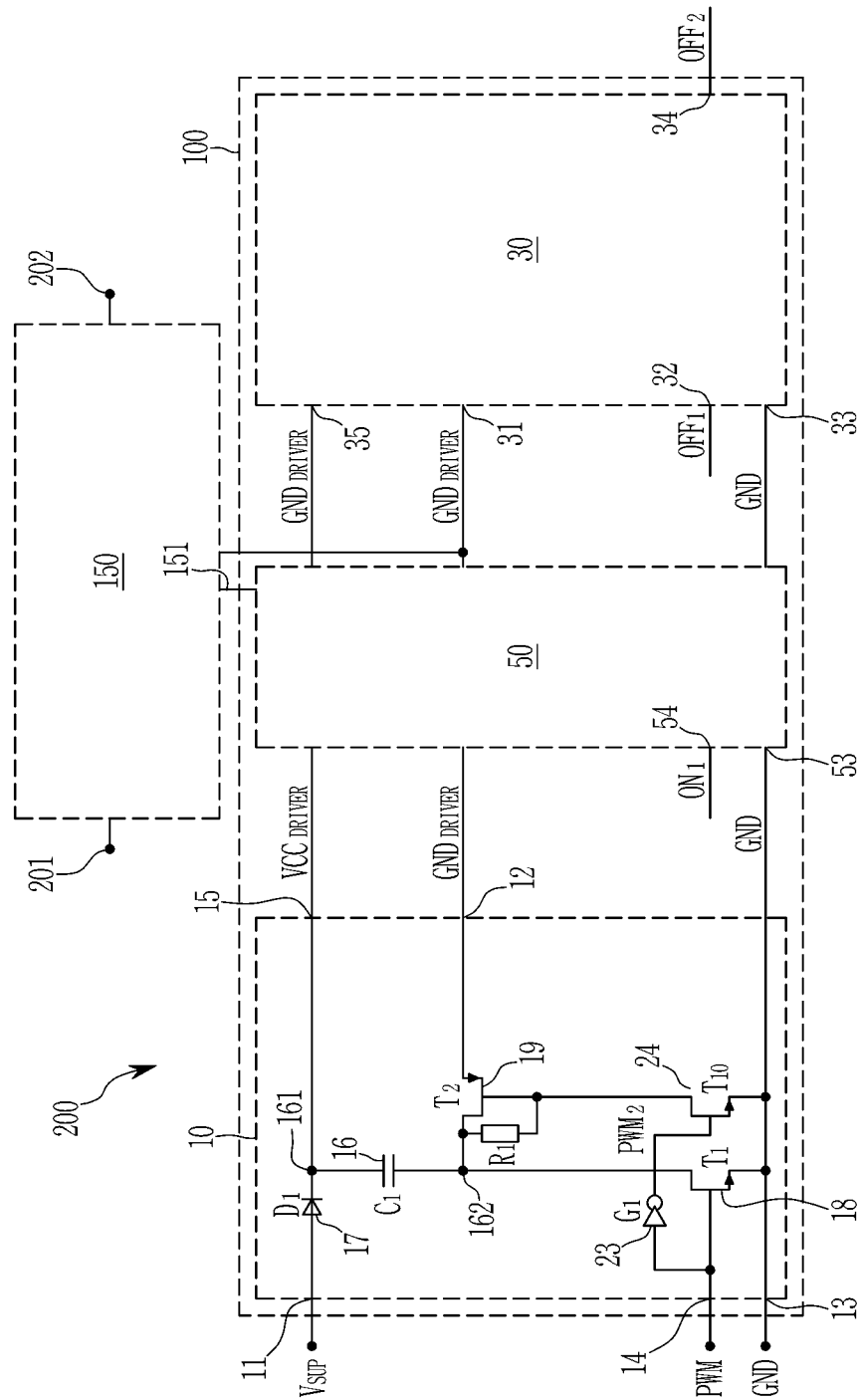
FIG. 2 schematically illustrates a solid state switch driver circuit according to some example embodiments.

FIG. 2 schematically illustrates a solid state switch driver circuit 100 according to some example embodiments. The basic configuration of the embodiment as illustrated in FIG. 2 is identical to (or similar to) the embodiment as shown in FIG. 1. Accordingly, some repeated description may be omitted and the same reference signs are used for the same components. However, the embodiment of FIG. 2 is distinguished by the use of specific components as described in the following.

For example, VGC 10 of the SSS driver circuit 100 of FIG. 2 comprises a first capacitor C1 16 with a first capacitor node 161 and a second capacitor node 162. The first capacitor node 161 is connected to the first input node 11 via a first diode 17. For example, the first capacitor node 161 is connected to the cathode of the first diode 17 and the cathode of the first diode 17 is connected to the first input node 11. The first capacitor node 161 is also connected to the first output node 15, i.e., is interconnected between the first output node 15 and the cathode of the first diode 17. The second capacitor node 162 is connected to ground node 13 via a first switch 18 and is connected to the second input node 12 via a second switch 19.

For example, the first switch 18 is a first MOSFET $T_1$ (n-channel) with a source node connected to the first ground node 13 and a drain node connected to the second capacitor node 162. The gate of the first MOSFET $T_1$ is connected to the first control node 14, i.e., receives the first control signal, PWM. Hence, if PWM takes a high value, e.g., "1" or VDD, the ground voltage GND is applied to the second capacitor node 162 via the first switch 18. Then, the first capacitor 16 is charged via the first diode 17 with $V_{SUP}$ provided by the first input node 11 and hence a voltage drop between GND and $V_{SUP}$ may occur over C1.

Further, the second switch 19 is a second MOSFET $T_2$ (p-channel) with a source node connected to the second input node 12 and a drain node connected to second capacitor node 162. A gate node of second MOSFET $T_2$ is connected to first ground node 13 via another n-channel MOSFET $T_{10}$, a source node of which is connected to first ground node 13, a drain node of which is connected to the gate node of the second MOSFET $T_2$ and a gate node of which is connected to the first control node 14 via an inverter 23. Hence, if the PWM takes a low value, e.g., "0" or VSS, the MOSFET $T_{10}$ is set to be conductive and connects the first ground node 13 with the gate node of second MOSFET $T_2$ and thus sets second MOSFET $T_2$ to be conductive. Then, the second input node 12 is connected to the second capacitor node 162 which is thus set to the potential $GND_{DRIVER}$. Due to the voltage drop over the charged first capacitor 16 C1 thus a voltage equal to the sum of $V_{SUP}$ and $GND_{DRIVER}$ applies to the first capacitor node 161. In other words, the VGC 10 operates as a DCDC converter with flying cap capacitor C1. Alternatively, also an n-channel MOSFET could be used for second switch $T_2$, the gate of MOSFET $T_2$ being then connected to the first control node 14 via the first converter 23.

Figure 3:
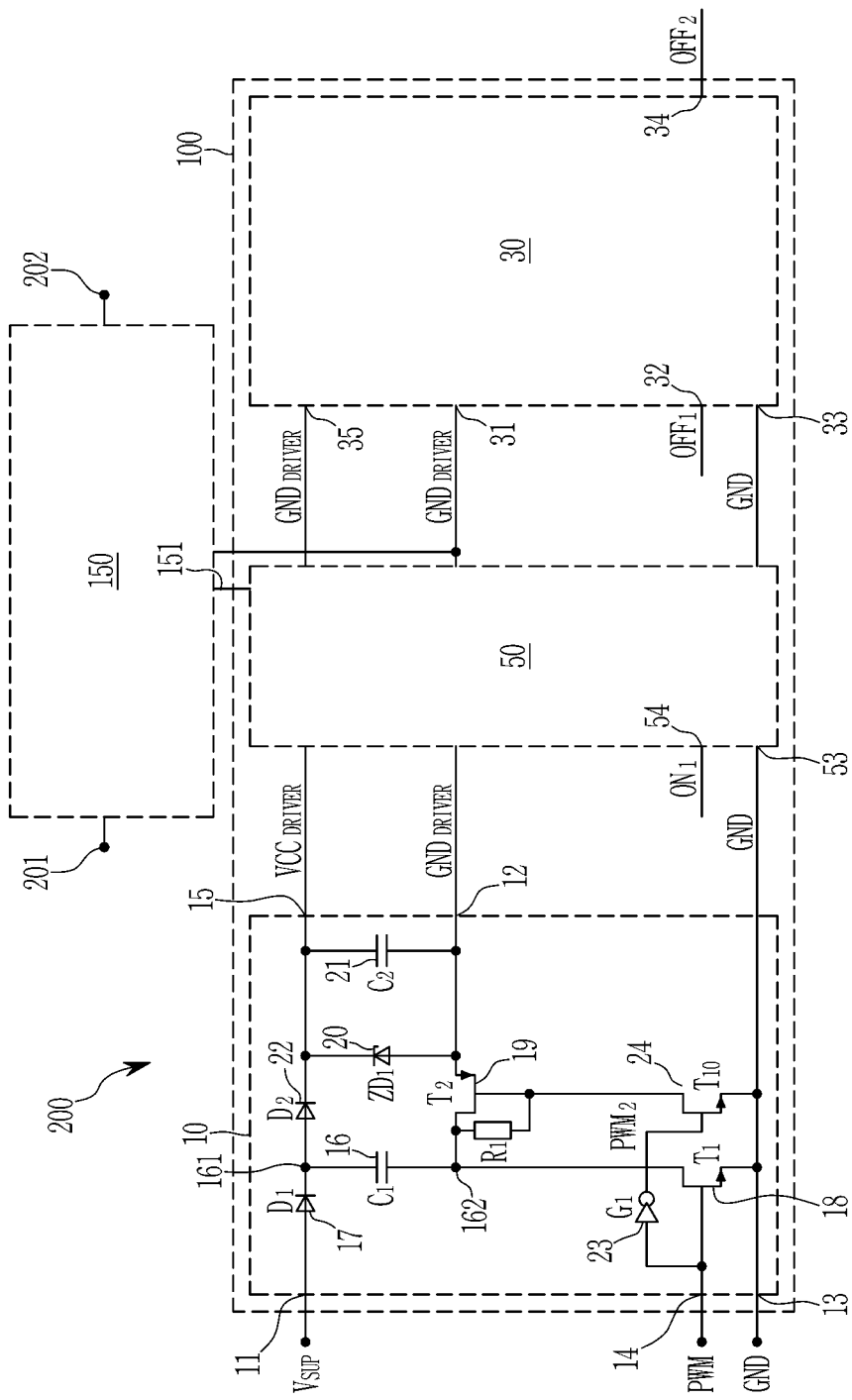
FIG. 3 schematically illustrates a solid state switch driver circuit according to some example embodiments.

FIG. 3 schematically illustrates a solid state switch driver circuit 100 according some example embodiments. The basic configuration of the embodiment as illustrated in FIG. 3 is identical (or similar) to the embodiment as shown in FIGS. 1 and 2. Accordingly, some repeated description may be omitted and the same reference signs may be used for the same components. However, the embodiment of FIG. 3 is distinguished by the use of specific components as described in the following.

For example, in the embodiment of FIG. 3, the VGC 10 further comprises a Zener diode 20 that is interconnected between the first output node 15 and the second input node 12. For example, the cathode of the Zener diode 20 is connected to a node that is interconnected between the first output node 15 and the first capacitor node 161 of the first capacitor 16. Further, the anode of the Zener diode 20 is connected to a node that is interconnected between the second switch 19 and the second input node 12. The Zener diode 20 functions as a protection diode that is configured for ensuring that the drive voltage $VCC_{DRIVER}$ is limited to a certain value. Accordingly, the third switch $T_3$ may be protected.

The VGC 10 of the third embodiment further comprises a second capacitor 21 that is interconnected in parallel to the first capacitor 16 in between the first output node 15 and the second input node 12. For example, a first capacitor node of the second capacitor 21 is interconnected between the first output node 15 and the node connected to the cathode of the Zener diode 20. Further, a second capacitor node of the second capacitor 21 is interconnected between the second input node 12 and the node connected to the anode of the Zener diode 20. During the operation of the VGC 10, the second capacitor 21 is charged with the voltage that applies to the first capacitor node 161 of the first capacitor 16 over the second diode 22. Hence, when the second switch is set to be conductive, the second capacitor 21 is charged with the drive voltage $VCC_{DRIVER}$, i.e., the first capacitor node of the second capacitor 21 is charged to the drive voltage $VCC_{DRIVER}$. Accordingly, the second capacitor 21 stores energy for setting the first output node 15 to $VCC_{DRIVER}$ even if the voltage $V_{SUP}$ or the first control signals PWM is not longer supplied to the VGC 10. Accordingly, the charged second capacitor 21 is configured to provide energy for setting SSS 150 conductive for a time period (e.g., a set or predetermined time period), for example, for a time period that allows fulfilling ASIL B requirements with respect to availability of the SSS 150, e.g., for a time of 35 seconds to 1 minute.

Figure 4:
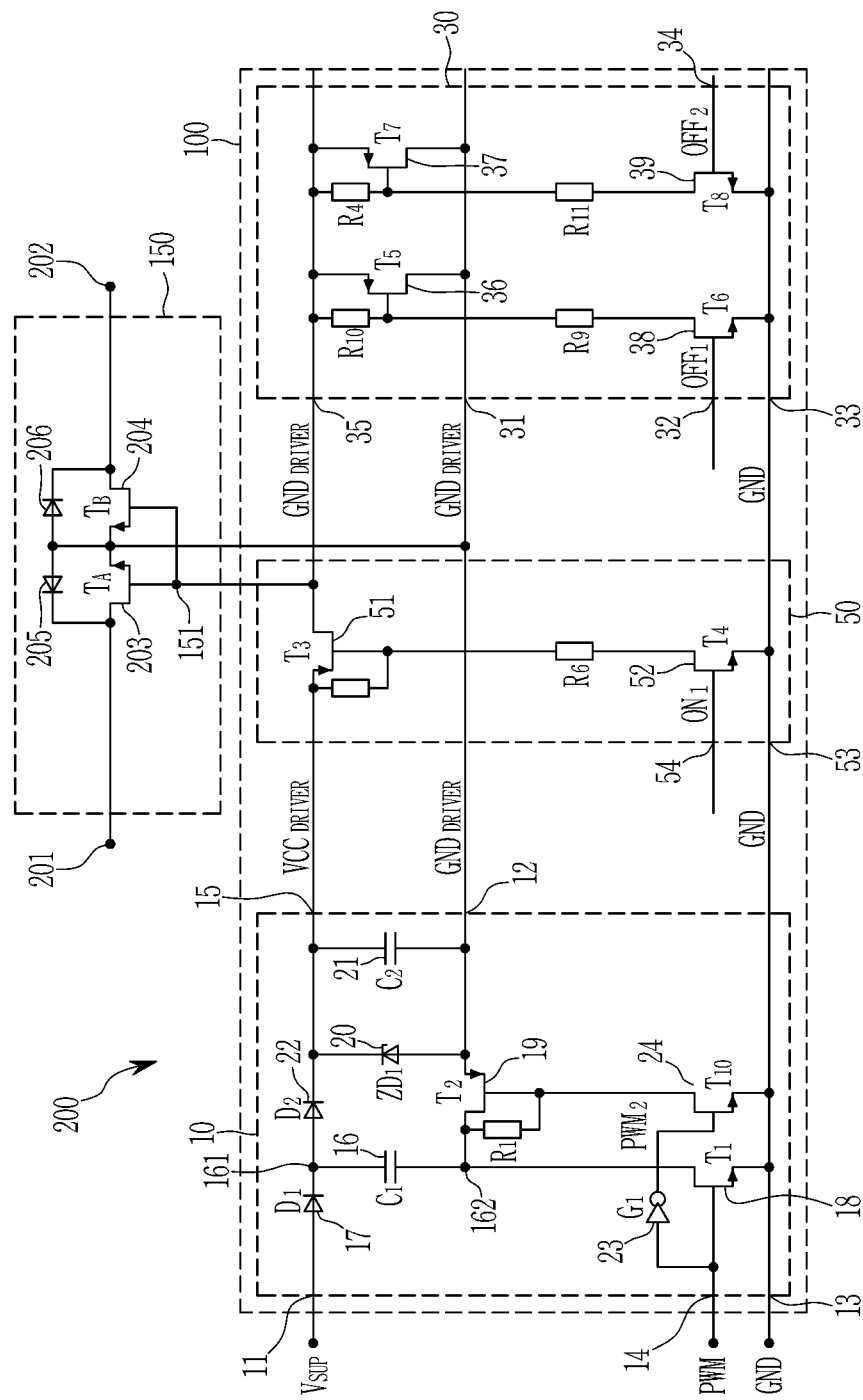
FIG. 4 schematically illustrates a solid state switch driver circuit according to some example embodiments.

FIG. 4 schematically illustrates a solid state switch driver circuit 100 according to some example embodiments. The basic configuration of the embodiment as illustrated in FIG. 4 is identical (or similar) to the embodiments as shown in FIGS. 1 to 3. Accordingly, some repeated description may be omitted and the same reference signs are used for the same components. However, the embodiment of FIG. 4 is distinguished by the use of specific components as described in the following.

According to some example embodiments, as illustrated in FIG. 4, the solid state switch (SSS) 150 is specified to comprise at least one set of anti-serially interconnected FETs, wherein each set comprising at least one first FET, TA, 203 and at least one second FET, TB, 204. Therein, the gate contacts of the FETs 203, 204 are electrically interconnected and the source contacts of the FETs 203 and 204 are electrically interconnected. Further, the drain contact(s) of the at least one first FET 203 is/are electrically connected to the stack node 201 and the drain contact(s) of the at least one second FET 204 is/are electrically connected to the supply node 202. In this configuration, both FETs 203, 204 can be controlled at once by applying a gate voltage to the gates of the FETs 203, 204 via the gate node 151. Further, the SSS 150 comprises a first flyback (free wheeling) diode 205 connected in parallel with the first FET 203 and a second flyback diode 206 connected in parallel with the second FET 204, these diodes protecting the FETs 203, 204.

Figure 5:
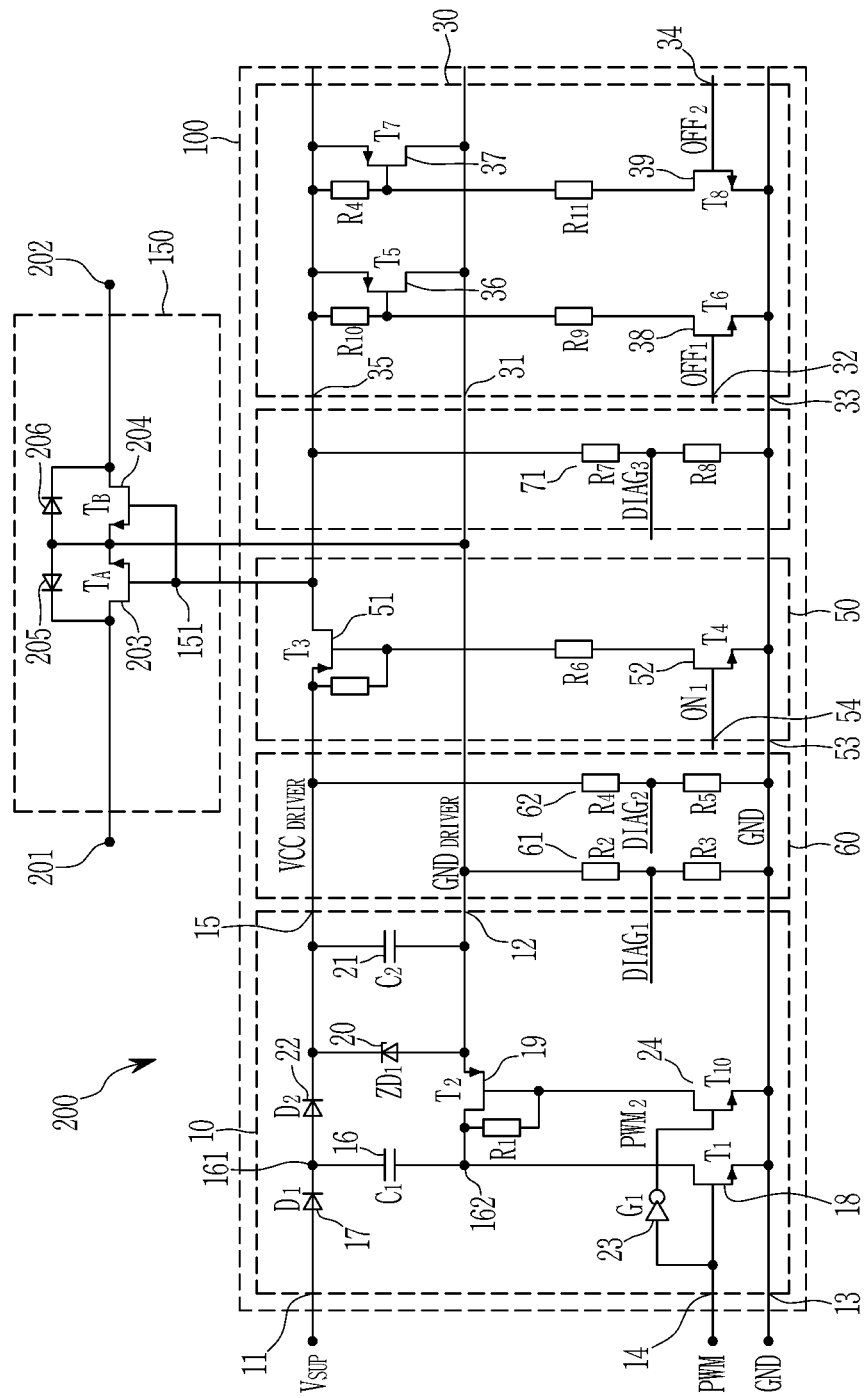
FIG. 5 schematically illustrates a solid state switch driver circuit according to some example embodiments.

Further, in FIG. 5 it is illustrated that the SOC 30 comprises a fifth switch 36 that is a fifth p-channel MOSFET $T_5$ with a drain node connected to the third input node 31, for example, receiving $GND_{DRIVER}$, and a drain node connected to the second output node 35. A gate node of MOSFET $T_5$ is connected to the second ground node 33 via a sixth switch 38 that is a sixth n-channel MOSFET $T_6$. For example, the source node of MOSFET $T_6$ is connected to the second ground node 33, the drain node of MOSFET $T_6$ is connected to the gate node of MOSFET $T_5$ and a gate node of MOSFET $T_6$ is connected to the second control node 32. That is, if the second control signal OFF1 takes a high value, e.g., "1" or VDD, MOSFET $T_6$ is set to be conductive and applies ground voltage GND to the gate node of MOSFET $T_5$. Hence, the gate channel of MOSFET $T_5$ is set to be conductive and the cell stack's output voltage $GND_{DRIVER}$ is applied to the second output node and to the gate node 151 of the SSS 150, thus setting the FETs 203 and 204 to be non-conductive, hence disconnecting stack node 201 from supply node 202.

Further, in FIG. 5 it is illustrated that the SOC 30 comprises a seventh switch 37 that is a seventh p-channel MOSFET $T_7$ with a drain node connected to the third input node 31, i.e., receiving $GND_{DRIVER}$, and a drain node connected to the second output node 35. A gate node of MOSFET $T_7$ is connected to the second ground node 33 via an eighth switch 39 that is a eighth n-channel MOSFET $T_8$. For example, the source node of MOSFET $T_8$ is connected to the second ground node 33, the drain node of MOSFET $T_8$ is connected to the gate node of MOSFET $T_7$ and a gate node of MOSFET $T_8$ is connected to the third control node 34. That is, if the third control signal OFF2 takes a high value, e.g., "1" or VDD, MOSFET $T_8$ is set to be conductive and applies ground voltage GND to the gate node of MOSFET $T_7$. Hence, the gate channel of MOSFET $T_7$ is set to be conductive and the cell stack's output voltage $GND_{DRIVER}$ is applied to the second output node and to the gate node 151 of the SSS 150, thus setting the FETs 203 and 204 to be non-conductive, hence disconnecting stack node 201 from supply node 202.

Further, in FIG. 5 it is specified that the switch controller 50 comprises a third switch 51 that is a third p-channel MOSFET $T_3$ a source node of which is connected to the first output node 15 and a drain node of which is connected to the gate node 151, e.g., to a node interconnected between the gate node 151 and the second output node 35. That is, a voltage applied to the drain node of MOSFET $T_3$ is applied to gate node 151 insofar it is higher than the voltage that applies to the second output node 35. The gate node of the MOSFET $T_3$ is connected to the third ground node 53 via a fourth switch 52 that is a fourth n-channel MOSFET $T_4$. The source node of MOSFET $T_4$ is connected to the third ground node 53, the drain node of the MOSFET $T_4$ is connected to the gate node of MOSFET $T_3$ and the gate node of MOSFET $T_4$ is connected to the fourth control node 54, i.e., receives fourth control signal ON1. That is, if the fourth control signal ON1 takes a high value, e.g., "1" or VDD, MOSFET $T_4$ is set to be conductive and applies ground voltage GND to the gate node of MOSFET $T_3$. Hence, the gate channel of MOSFET $T_3$ is set to be conductive and the voltage at the first output node 15 is applied to the gate node 151 of SSS 150 setting FETs 203 and 204 to be conductive.

FIG. 5 schematically illustrates a solid state switch driver circuit 100 according to some example. The basic configuration of the embodiment as illustrated in FIG. 5 is identical (or similar) to the embodiments as shown in FIGS. 1 to 4. Accordingly, some repeated description may be omitted and the same reference signs are used for the same components. However, the embodiment of FIG. 5 is distinguished by the use of specific components as described in the following.

In the fifth embodiment as illustrated in FIG. 5, the SSS driver circuit 100 further comprises a first diagnostic circuit 60 that is configured to output a first diagnostic signal ($DIAG_1$) indicating a potential at the second input node 12 and to output a second diagnostic signal (DIAG2) indicating a potential at the first output node 15. For example, the first diagnostic circuit 60 comprises a first voltage divider 61 with a first divider node connected to the second input node 12 and a second divider node connected to the first ground node 13. An output node of the first voltage divider 61 then provides the first diagnostic signal DIAG1. Further, the first diagnostic circuit 60 comprises a second voltage divider 62 with a first divider node connected to the first output node 15 and a second divider node also connected to first ground node 13. An output node of the second voltage divider 62 then provides the second diagnostic signal DIAG2. The first diagnostic circuit 60 thus provides diagnostic signals that are indicative of the voltage drop over the second capacitor 21 as described above.

Hence, the first diagnostic circuit 60 allows detecting malfunctions in the battery system 200, as the first diagnostic circuit 60 receives the same voltage, $GND_{DRIVER}$, as applied to the input of the SSS. The first diagnostic circuit further allows testing of the fifth switch $T_5$ and the seventh switch $T_7$. For example, if $T_3$ is switched on, the switching off functionality of $T_7$ and $T_9$ can be diagnosed: Therefore, the drive voltage $VCC_{DRIVER}$ is generated with a voltage that is lower than $V_{TH}$ of the power MOSFETs 203, 204. Then, the functionality of $T_5$ and $T_7$ is tested individually by setting OFF1 and OFF2 to high signal individually and detecting the voltage with the first voltage divider 61, while third switch $T_3$ is set to be conductive via ON1. Therein, as $VCC_{DRIVER}$ is controlled to be less than $V_{TH}$ of FETs 203, 204 the SSS 150 is not closed. By the same approach, also the functionality of third switch $T_3$ can be tested by detecting DIAG 1 and comparing it to the signal DIAG2 representative of the voltage at first output node 15.

In the fifth embodiment as illustrated in FIG. 5, the SSS driver circuit 100 further comprises a second diagnostic circuit 70 that is configured to output a third diagnostic signal ($DIAG_3$) which is indicating a potential at the second output node 35. For example, the second diagnostic circuit 70 is configured to output a third diagnostic signal, $DIAG_3$, indicating a potential at the drain node of the third switch MOSFET $T_3$ or more precisely the voltage at a node interconnected between the drain node of MOSFET $T_3$ and the second output node 35. The second diagnostic circuit 70 comprises a third voltage divider 71 with a first divider node connected in between the second output node 35 and the drain node of the third switch MOSFET $T_3$ and a second divider node connected to ground, GND. The second diagnostic circuit 70 allows for testing the functionality of the switches $T_3$ also while operating the voltage generation circuit 10 with a PWM signal that leads to an output voltage at the first output node that is less than the $V_{TH}$ of the power FETs 203, 204. The second diagnostic circuit may be further used for testing the switching off capability of the fifth and seventh switches $T_5$, $T_7$.

LISTING OF SOME REFERENCE NUMERALS AND SYMBOLS 100 solid state switch driver circuit
10 voltage generation circuit
11 first input node
12 second input node
13 first ground node
14 first control node
15 first output node
16 first capacitor
161 first capacitor node
162 second capacitor node
17 first diode
18 first switch
19 second switch
20 Zener diode
21 second capacitor
22 second diode
23 inverter
30 switch off circuit
31 third input node
32 second control node
33 second ground node
34 third control node
35 second output node
36 fifth switch
37 seventh switch
38 sixth switch
39 eighth switch
50 switch controller
51 third switch
52 fourth switch
53 third ground node
54 fourth control node
150 solid state switch (SSS)
151 gate node of SSS
200 battery system
201 stack node
202 supply node
203 first FET(s)

204 second FET(s)
205 first flyback diode
206 second flyback diode

What is claimed is:

1. A solid state switch (SSS) driver circuit for controlling a solid state switch operated as high side switch between a battery cell stack and a load, the SSS driver circuit comprising:
a voltage generation circuit configured to receive:
a supply voltage via a first input node;
an output voltage of the battery cell stack via a second input node;
a ground voltage via a first ground node; and
a first control signal, wherein the voltage generation circuit is configured to:
generate a drive voltage higher than the supply voltage and the output voltage of the battery cell stack according to the first control signal; and
output the drive voltage to a first output node;
a switch off circuit configured to receive:
the output voltage of the battery cell stack via a third input node;
a ground voltage via a second ground node;
a second control signal; and
a third control signal, wherein the switch off circuit is further configured to output the output voltage of the battery cell stack to a second output node according to the second and third control signals; and
a switch controller connected to the first output node and to the second output node, wherein the switch controller is configured to:
receive a ground voltage via a third ground node, and a fourth control signal; and
connect the first output node and a gate node of the solid state switch according to the fourth control signal.

2. The SSS driver circuit of claim 1, wherein the voltage generation circuit comprises a first capacitor with a first capacitor node connected to the first input node via a first diode and with a second capacitor node connected to either the first ground node or to the second input node according to the first control signal.

3. The SSS driver circuit of claim 2, wherein the voltage generation circuit comprises a first switch configured to connect the second capacitor node to the first ground node in response to the first control signal having a first value and a second switch configured to connect the second capacitor node to the second input node in response to the first control signal having a second value.

4. The SSS driver circuit of claim 2, wherein the voltage generation circuit comprises a Zener diode interconnected between a first output node and a second input node and/or comprises a second capacitor interconnected between the first output node and the second input node.

5. The SSS driver circuit of claim 1, wherein the switch controller comprises a third switch configured to connect the first output node to the gate node in response to the fourth control signal having a first value, and to disconnect the first output node from the gate node in response to the fourth control signal having a second value, wherein the second output node is directly connected to the gate node.

6. The SSS driver circuit of claim 5, wherein the third switch is a third MOSFET with a source node connected to the first output node and a drain node connected to the second output node and wherein the switch controller further comprises a fourth switch that is configured to connect a gate node of the third MOSFET to the third ground node in response to the fourth control signal having a first value and to disconnect the gate node of the third MOSFET from the third ground node in response to the fourth control signal having a second value.

7. The SSS driver circuit of claim 1, wherein the switch off circuit comprises a fifth switch configured to:
connect the third input node to the second output node in response to the second control signal having a first value; and
disconnect the third input node from the second output node in response to the second control signal having a second value, and wherein the switch off circuit comprises a seventh switch configured to:
connect the third input node to the second output node in response to the third control signal having a first value; and
disconnect the third input node from the second output node in response to the third control signal having a second value.

8. The SSS driver circuit of claim 7, wherein the fifth switch is a fifth MOSFET with a source node connected to the second output node and a drain node connected to the third input node and wherein the switch off circuit further comprises a sixth switch configured to:
connect a gate node of the fifth MOSFET to the second ground node in response to the second control signal having a first value; and
disconnect the gate node of the fifth MOSFET from the second ground node in response to the second control signal having a second value.

9. The SSS driver circuit of claim 7, wherein the seventh switch is a seventh MOSFET with a source node connected to the second output node and a drain node connected to the third input node and wherein the switch off circuit further comprises an eighth switch configured to:
connect a gate node of the seventh MOSFET to the second ground node in response to the third control signal having a first value; and
disconnect the gate node of the seventh MOSFET from the second ground node in response to the third control signal having a second value.

10. The SSS driver circuit of claim 1, further comprising a first diagnostic circuit configured to:
output a first diagnostic signal indicating a potential at the second input node; and
output a second diagnostic signal indicating a potential at the first output node.

11. The SSS driver circuit of claim 1, further comprising a second diagnostic circuit configured to output a third diagnostic signal indicating a potential at the second output node.

12. A battery system, comprising
a battery cell stack comprising a plurality of battery cells, wherein the battery cell stack is configured to supply an output voltage to a stack node;
a solid state switch interconnected between the stack node and a supply node, the solid state switch comprising at least one set of anti-serially interconnected FETs, each set comprising at least one first FET and at least one second FET, wherein gate contacts of the at least one first FET and the at least one second FET are electrically interconnected, and source contacts of the at least one first FET and the at least one second FET are electrically interconnected, at least one first drain contact of the at least one first FET is electrically connected to the stack node, and at least one second drain contact of the at least one second FET is electrically connected to the supply node; and the SSS driver circuit according to claim 1, wherein interconnected gate contacts of the at least one first FET and the at least one second FET are connected to the gate node.

13. The battery system of claim 12, wherein the supply voltage is supplied by the battery cell stack by a system basis chip of the battery system that is power supplied by the battery cell stack.

14. The battery system of claim 12, further comprising a microcontroller configured to receive at least one signal indicative of an operation state of the battery system and further configured to output the first control signal, the second control signal, and the third control signal according to the operation state of the battery system.

15. The battery system of claim 14, wherein the microcontroller is further configured to receive a first diagnostic signal, a second diagnostic signal, and a third diagnostic signal.

\* \* \* \* \*